(12) United States Patent
Andreaco et al.

(10) Patent No.: US 10,774,440 B2
(45) Date of Patent: *Sep. 15, 2020

(54) CRYSTAL GROWTH ATMOSPHERE FOR OXYORTHOSILICATE MATERIALS PRODUCTION

(71) Applicant: Siemens Medical Solutions USA, Inc., Malvern, PA (US)

(72) Inventors: Mark S. Andreaco, Knoxville, TN (US); Peter Carl Cohen, Knoxville, TN (US); Alexander Andrew Carey, Lenoir City, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 34 days.

This patent is subject to a terminal disclaimer.

(21) Appl. No.: 16/251,118

(22) Filed: Jan. 18, 2019

(65) Prior Publication Data

US 2019/0153614 A1 May 23, 2019

Related U.S. Application Data

(60) Continuation-in-part of application No. 14/623,760, filed on Feb. 17, 2015, now Pat. No. 10,227,709, which is a division of application No. 12/953,582, filed on Nov. 24, 2010, now abandoned.

(51) Int. Cl.
*C30B 15/04* (2006.01)
*C09K 11/77* (2006.01)
*C30B 29/34* (2006.01)
*C30B 15/02* (2006.01)

(52) U.S. Cl.
CPC .......... *C30B 15/04* (2013.01); *C09K 11/7706* (2013.01); *C09K 11/7774* (2013.01); *C30B 15/02* (2013.01); *C30B 29/34* (2013.01)

(58) Field of Classification Search
CPC ......... C30B 15/00; C30B 15/02; C30B 15/04; C30B 15/14; C30B 15/20; C30B 29/00; C30B 29/10; C30B 29/34; C09K 11/7706; C09K 11/7774
USPC ...... 117/11, 13–15, 19–20, 35–36, 906, 937, 117/942
See application file for complete search history.

(56) References Cited

U.S. PATENT DOCUMENTS

| | | |
|---|---|---|
| 4,415,401 A | 11/1983 | Wald et al. |
| 4,443,411 A | 4/1984 | Kalejs |
| 4,534,821 A | 8/1985 | Sakaguchi et al. |
| 4,591,409 A | 5/1986 | Ziem et al. |

(Continued)

FOREIGN PATENT DOCUMENTS

| | | |
|---|---|---|
| CN | 1250526 A | 4/2000 |
| CN | 102443844 A | 5/2012 |

OTHER PUBLICATIONS

Hoshino, T., et al., Determination of the Thermal Conductivity of Argon and Nitrogen over a Wide Temperature Range Through Data Evaluation and Shock-Tube Experiments; International Journal of Thermophysics, vol. 7, No. 3, pp. 647-662, 1986.

*Primary Examiner* — Kenneth A Bratland, Jr.

(57) ABSTRACT

A method of growing a rare-earth oxyorthosilicate crystal, and crystals grown using the method are disclosed. The method includes preparing a melt by melting a first substance including at least one first rare-earth element and providing an atmosphere that includes an inert gas and a gas including oxygen.

20 Claims, 5 Drawing Sheets

(56) References Cited

U.S. PATENT DOCUMENTS

| | | |
|---|---|---|
| 5,131,974 A | 7/1992 | Oda et al. |
| 5,164,041 A | 11/1992 | Berkstresser et al. |
| 6,278,832 B1 | 8/2001 | Zagumennyi et al. |
| 6,303,048 B1 | 10/2001 | Kawanka et al. |
| 6,514,336 B1 | 2/2003 | Zavartsev et al. |
| 6,997,986 B2 | 2/2006 | Sato |
| 7,264,750 B2 | 9/2007 | Kurashige et al. |
| 7,297,954 B2 | 11/2007 | Kurashige et al. |
| 7,618,491 B2 * | 11/2009 | Kurata .................... C30B 29/34 117/13 |
| 8,278,624 B2 | 10/2012 | Koschan et al. |
| 10,227,709 B2 * | 3/2019 | Andreaco ............... C30B 15/02 |
| 2003/0159643 A1 | 8/2003 | Sumiya et al. |
| 2004/0149201 A1 | 8/2004 | Sato |
| 2006/0266276 A1 * | 11/2006 | Shimura ................. C30B 31/08 117/19 |
| 2006/0266277 A1 | 11/2006 | Usui et al. |
| 2006/0266945 A1 * | 11/2006 | Kurashige ............... G21K 4/00 250/361 R |
| 2007/0277726 A1 | 12/2007 | Usui et al. |
| 2007/0292330 A1 | 12/2007 | Kurata et al. |

* cited by examiner

CRYSTAL GROWTH ATMOSPHERE FOR OXYORTHOSILICATE MATERIALS PRODUCTION

CROSS-REFERENCE TO RELATED APPLICATIONS

This application is a continuation-in-part of U.S. Patent Application having Ser. No. 14/623,760 filed on Feb. 17, 2015, which is a divisional application of U.S. Patent Application having Ser. No. 12/953,582 filed on Nov. 24, 2010 (now abandoned), the entire contents of which are hereby incorporated by reference.

FIELD OF INVENTION

This application relates to the growth of crystals.

BACKGROUND

In some methods for growing crystals, such as the Czochralski method, a seed crystal is brought into contact with the surface of a melt and then withdrawn from the melt. A crystal grows on the seed as it is withdrawn. The seed and growing crystal are sometimes also rotated about a vertical axis as they are withdrawn. Growth instabilities often occur in large crystals grown using this technique. As an example, the crystal may begin to grow in a spiral shape instead of a desired cylindrical shape. Growth instabilities may result in stresses due to variations in thermal expansion coefficients within the crystal, which may cause the crystal to shatter. This shattering is more likely when significant temperature gradients are present in the melt and in the atmosphere above the melt in which the crystal grows.

Growth instabilities may be caused by sufficiently large temperature gradients, accumulation of impurities in the melt, changes in the charge states of some of the melt constituents leading to creation of different molecular complexes, as well as by excesses of melt constituents accumulating at the interface between the surface of the melt and the growing crystal.

In the growth of rare-earth oxyorthosilicate scintillator crystals, oxygen vacancies in the crystal lattice may act as charge traps that lower the amount of charge carriers (electrons and holes) generated when the crystal absorbs ionizing radiation. The results are a lowering of scintillation efficiency and an undesirable persistent emission of light from the crystal known as afterglow. Reducing concentration of such oxygen vacancies is therefore desirable. This has been partially achieved by annealing the grown crystal in an oxygen-containing atmosphere. This is an extra step in the preparation of such crystals.

SUMMARY

A method of growing rare-earth oxyorthosilicate crystals and the crystals grown with the method are disclosed. The method includes providing an atmosphere for crystal growth including an inert gas and a gas including oxygen.

DETAILED DESCRIPTION

Figure 1:
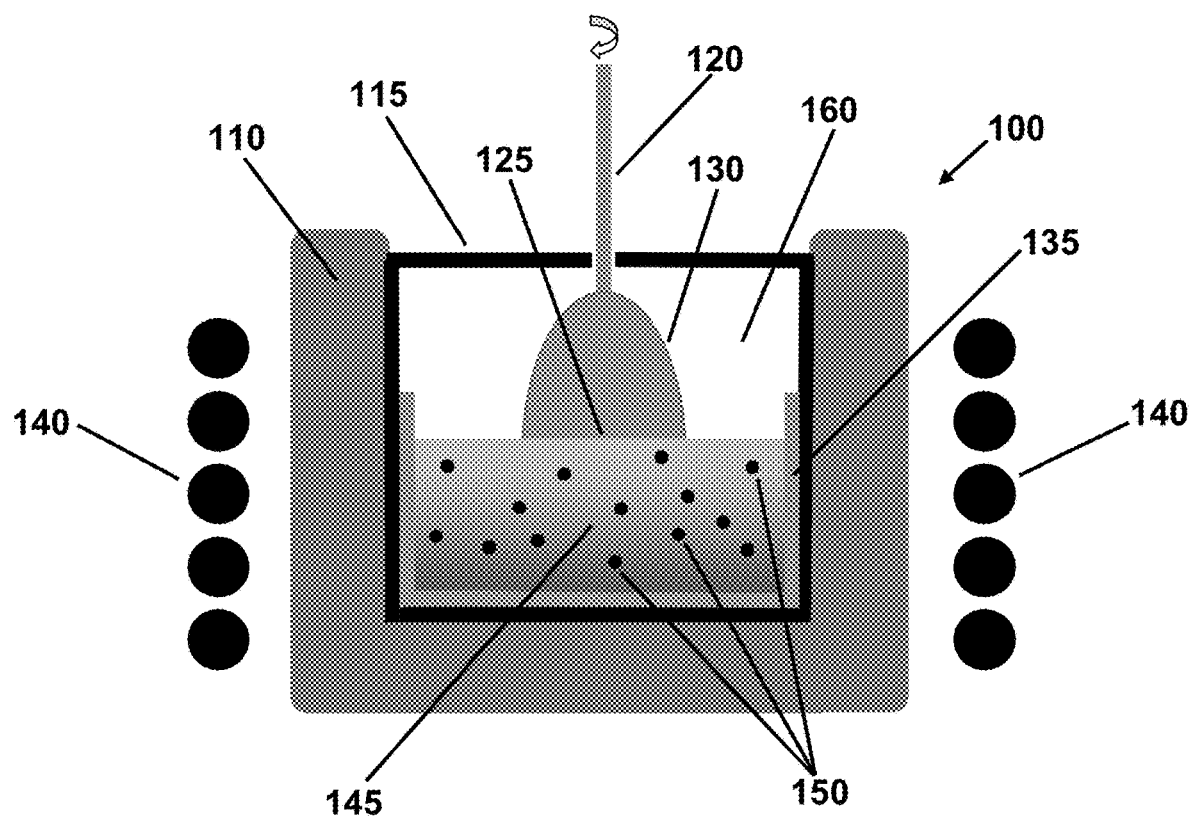
FIG. 1 shows an example apparatus for growing a crystal.

Control of the atmosphere above a melt during crystal growth using a method such as the Czochralski method may be crucial for controlling growth stability and controlling properties of the grown crystal. In particular, in the growth of rare-earth oxyorthosilicate scintillator crystals, careful control of the atmosphere and the melt composition may simultaneously minimize at least three problems in the growth of these crystals.

A first problem is the inclusion of oxygen vacancies in the grown crystal, which reduce the scintillation efficiency of the crystal and give rise to an undesirable persistent emission of light from the crystal known as afterglow. These oxygen vacancies may arise from a deficiency of oxygen during crystal growth. Rare-earth oxyorthosilicate scintillator crystals may be grown from a melt prepared by melting a rare-earth compound, such as an oxide, with a silicon oxide, such as $SiO_2$. Temperatures of 2000° C. or higher may be needed to melt these substances. At these temperatures it may be desirable to use a nearly inert atmosphere to prevent introducing impurities into the melt. If a pure inert atmosphere is used, however, the $SiO_2$ may decompose into SiO (silicon monoxide) and oxygen. The result is a change in the stoichiometry of the grown crystal and the introduction of the undesirable oxygen vacancies. It has been found that introducing an oxygen containing species, such as carbon dioxide ($CO_2$), carbon monoxide (CO), or oxygen ($O_2$) into the atmosphere may reduce the concentration of the oxygen vacancies in the crystal and thereby achieve desired scintillation performance without a need for the above described post-growth anneal. Other gases that may decompose and liberate elemental oxygen include, as examples, sulfur trioxide ($SO_3$), several different oxides of nitrogen $NO_2$, $N_2O$, NO, $N_2O_3$, $N_2O_5$ and phosphorous pentoxide $P_2O_5$. However, except for nitrous oxide $N_2O$, these gases are more reactive than $CO_2$ with materials making up the interior of the furnace.

At the same time, the amount of oxygen introduced into the atmosphere must be kept low enough to avoid appreciable oxidation of materials used in the growth apparatus, such as the iridium and iridium alloys of the crucible, often used to contain the melt for the growth of these crystals. Oxidation of an iridium crucible may introduce contaminants into the melt and shorten the usable lifetime of the expensive iridium crucible. Thus, the amount of oxygen introduced must be carefully chosen.

A second problem with these crystals is cracking of the crystal during growth, which may result from excessive temperature gradients in growth chamber. This problem may be addressed by reducing the thermal conductivity of the growth atmosphere. Thermal conductivity contributes to the thermal diffusivity, which determines how rapidly any temperature change diffuses through an atmosphere. Lower thermal conductivity results in greater stability of temperature gradients in the growth chamber, isolating a crystal boule from any fluctuation in temperature in the surrounding environment.

At the same time, it may be desirable to control temperature gradients in the melt that stimulate the oxygen transport in the crystal-melt interface. One way benefits may occur is through the phenomenon known as Marangoni flow, a type of fluid flow driven by gradients in surface tension. The surface tension gradients may, in turn, be produced by increasing the temperature gradients in the melt surface.

A third problem arises in the growth of these crystals, in particular with cerium-doped lutetium oxyorthosilicate scintillator crystals. If grown as described above in an oxygen-containing atmosphere, some of the cerium in the crystal may undergo a change of oxidization state, from the desired 3+ state to a 4+ state. The result is a yellowing of the crystal, which adversely affects the scintillation performance of the crystal, while reducing optical clarity. It has been found that adding to the melt at least one element from group 2, group 3, group 6, or group 7 of the periodic table in any combination will effectively eliminate this yellowing. It has also been found that the adding at least one such element further stabilizes the growth of the crystal, preventing such instabilities as spiral structures and other departures from cylindrical growth. Group 2 elements include beryllium (Be), magnesium (Mg), calcium (Ca), strontium (Sr) and barium (Ba). Group three elements include scandium and yttrium. Group 6 elements include chromium (Cr), molybdenum (Mo), and tungsten (W). Group 7 elements include manganese (Mn) and rhenium (Re). By careful choice and control of growth atmosphere and melt composition, therefore, both physical stability and composition of the crystal may be controlled to achieve multiple desirable results.

FIG. 1 shows an embodiment of a crystal-growing apparatus 100 including a melt 145. Melt 145 may be made by melting a first substance that includes at least one first rare-earth element, and a second substance that includes at least one element 150 from group 2, group 3, group 6, or group 7. Alternatively, at least one rare-earth element and at least one element from group 2, group 3, group 6, or group 7, may both be included in one substance. The first substance may be an oxide of the first rare-earth element. Melt 145 may also include melted $SiO_2$ (silica). Melt 145 may also include a melted third substance that includes a second rare-earth element distinct from the first rare-earth element.

Melt 145 may be contained in a crucible 135, which may be made of iridium. Crucible 135 is contained in an enclosure 115. Enclosure 115 may be utilized to control an ambient atmosphere 160 above the melt surface in which a rare-earth oxyorthosilicate crystal is growing as a crystal boule 130. Surrounding enclosure 115 is a thermally insulating material 110. Melt 145 is maintained in a molten state by inductive heating of crucible 135, the heating produced by RF induction coil 140. Crystal boule 130 grows at or near an interface 125 between a portion of the boule that is already grown and a surface of melt 145. Growth of crystal boule 130 is initiated by attaching a seed crystal (not shown) to a rod 120. Rod 120 is slowly lifted upward as crystal growth proceeds. Rod 120 may also be rotated, as indicated by an arrow. Although the arrow indicates rotation of rod 120 in a clockwise direction as seen from above, rod 120 may also be rotated counterclockwise as seen from above.

Melt 145 may include a melted third substance that includes a second rare-earth element. The second rare-earth element may be, but is not limited to, cerium (Ce). The second rare-earth element may be incorporated into crystal boule 130. The second rare-earth element may be incorporated into crystal boule 130 as a dopant. It may be incorporated as a substitutional dopant in the lattice of crystal boule 130. For example, a dopant atom of Ce may occupy a lattice position normally occupied by an Lu atom in a crystalline lattice of lutetium oxyorthosilicate.

Atmosphere 160 comprises at least one inert gas and at least one gaseous substance that includes oxygen. Atmosphere 160 is in contact with a surface of melt 145. As explained above, it may be desirable to use an inert gas with a lower thermal conductivity. The inert gas may comprise at least one of helium (He), argon (Ar), krypton (Kr), xenon (Xe), or nitrogen. If maintaining thermal gradients is less crucial, nitrogen, having a higher thermal conductivity, may be used. Thermal conductivity of the inert gas may be less than or equal to 150 mW/m-° K (milliwatts per meter-° K) at the temperature of the atmosphere during crystal growth. For example, the thermal conductivity of nitrogen at 2000° C. has been measured to be between about 70 and about 125 mW/m-° K, and the thermal conductivity of argon at 2000° C. has been measured to be between about 80 and about 100 mW/m-° K The gaseous substance including oxygen may include carbon dioxide, which may disassociate to carbon monoxide and additional oxygen. The gaseous substance including oxygen may include other oxygen-containing compounds that disassociate to oxygen, such as carbon monoxide, oxygen, sulfur trioxide ($SO_3$), phosphorous pentoxide ($P_2O_5$)) or an oxide of nitrogen, all of these in any combination. The oxide of nitrogen may include $NO_2$, $N_2O$, NO, $N_2O_3$, or $N_2O_5$ in any combination. Atmosphere 160 may comprise from 100 parts per million (ppm) to 100000 ppm (0.01 to 10 percent) of oxygen by volume, inclusive. Alternatively, atmosphere 160 may comprise oxygen by volume in a range between and including any two numerical values of ppm between 100 and 100000. In particular, atmosphere 160 may contain less than 300 ppm oxygen by volume. In particular, atmosphere 160 may contain less than 200 ppm oxygen by volume.

In an embodiment, the gaseous substance including oxygen may be derived from the decomposition of a solid or liquid salt that contains oxygen. In another embodiment, the gaseous substance including oxygen may be derived from the decomposition of an acid that contains oxygen. Room temperature ionic liquid salts may also be used so long as they contain an oxygen atom. Salts and acids that contain oxygen include carbonates, bicarbonates, sulfates, bisulfates, phosphates, nitrates, chromates, permanganates, or a combination thereof. Preferred salts include carbonates and/or bicarbonates. The carbonates and bicarbonates decompose to liberate carbon dioxide. Residues from the decomposition may be removed from the heating vessel.

Examples of carbonates are sodium carbonate, calcium carbonate, potassium carbonate, calcium-magnesium carbonate, ammonium carbonate, barium carbonate, copper carbonate, lanthanum carbonate, cesium carbonate, or a combination thereof. Examples of bicarbonates are sodium bicarbonate, calcium bicarbonate, potassium bicarbonate, magnesium bicarbonate, ammonium bicarbonate, or a combination thereof. Examples of sulfates are copper sulfate, calcium sulfate, strontium sulfate, lead(II) sulfate, barium sulfate, iron sulfate, magnesium sulfate, or a combination thereof. Examples of phosphates include potassium phosphate, rubidium phosphate, cesium phosphate, ammonium phosphate, or a combination thereof. Examples of nitrates include potassium nitrate, sodium nitrate, cesium nitrate, iron nitrate, ammonium nitrate, copper nitrate, or a combination thereof.

In another embodiment, an acid that contains oxygen may also be decomposed in the presence of the melt 145 to release an oxygen-containing gas. The acid may include nitric acid, phosphoric acid, carbonic acid, sulfuric acid, or a combination thereof.

The salts or acids generally decompose at elevated temperatures to produce gases that comprise oxygen. Gaseous substances that include oxygen (that are derived from the decomposition of solid and/or liquid salts are carbon dioxide, carbon monoxide, oxygen, sulfur trioxide ($SO_3$), phosphorous pentoxide ($P_2O_5$) or an oxide of nitrogen, all of these in any combination. The oxide of nitrogen may include $NO_2$, $N_2O$, $NO$, $N_2O_3$, or $N_2O_5$ in any combination. Atmosphere 160 may comprise from 100 parts per million (ppm) to 100000 ppm (0.01 to 10 percent) of oxygen by volume, inclusive. Alternatively, atmosphere 160 may comprise oxygen by volume in a range between and including any two numerical values of ppm between 100 and 100000. In particular, atmosphere 160 may contain less than 300 ppm oxygen by volume. In particular, atmosphere 160 may contain less than 200 ppm oxygen by volume. In particular, atmosphere 160 may contain less than 100 ppm oxygen by volume.

In an embodiment, the acid, the metal salt, the liquid salt, or a combination thereof is placed in proximity to the melt 145. In an embodiment, both the melt 145 and the acid, the metal and/or liquid salt are placed in the same heating vessel. The atmosphere around the melt 145 is first evacuated. Following the evacuation, the atmosphere is replaced with an inert gas. The melt 145 is then heated along with the acid, the metal and/or liquid salt. During the heating the metal and/or liquid salt is decomposed to liberate gases that contain oxygen. The atmosphere that contains oxygen may include carbon dioxide, carbon monoxide, oxygen, sulfur trioxide ($SO_3$), phosphorous pentoxide ($P_2O_5$) or an oxide of nitrogen, all of these in any combination. Gases released from the decomposition may be filtered prior to contacting the melt 145.

Figure 2:
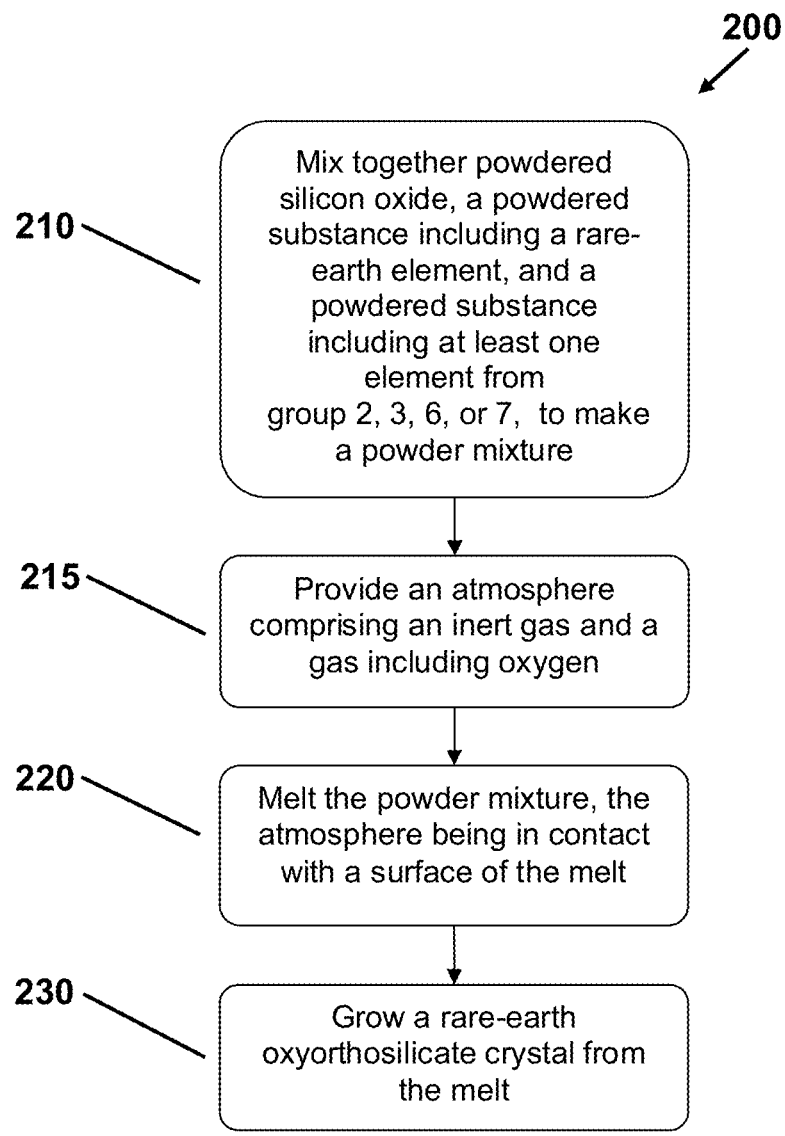
FIG. 2 is an example flow chart showing a method for growing a crystal.

FIG. 2 shows a first embodiment of a method of growing a rare-earth oxyorthosilicate crystal in a controlled atmosphere. As illustrated in FIG. 2, a powdered substance comprising at least one first rare-earth element may be mixed with a powdered silicon oxide such as silica ($SiO_2$) 210. A powdered substance that includes at least one element from group 2, 3, 6, or 7 is added to make a powder mixture 210. The powdered substance comprising at least one first rare-earth element may be a rare-earth oxide or a mixture of such oxides, such as $Lu_2O_3$, $Gd_2O_3$, or $La_2O_3$, or a mixture thereof. An oxide of an additional element, such as $Y_2O_3$, may also be added 210. The group 7 element may be, but is not limited to, manganese or rhenium. In addition, one or more substances including at least one element from group 2 of the periodic table may be introduced into the mixture at step 210. The addition of group 2 elements may contribute stabilizing growth of the crystal. A second powdered substance comprising a second rare-earth element maybe mixed with the powder mixture at step 210. The second powdered substance may be a rare-earth oxide or any rare-earth compound including an oxygen moiety. As an example, a powdered substance including cerium, such as a cerium oxide $CeO_2$ may be introduced into the powder mixture for the purpose of growing an oxyorthosilicate crystal doped with cerium as a scintillator crystal.

In step 215 an atmosphere, 160 in FIG. 1, is provided comprising an inert gas and a gas including oxygen, as described above.

In step 220 the powder mixture is melted in crucible 135 to produce melt 145, atmosphere 160 being in contact with a surface of the melt. In step 230 a rare-earth oxyorthosilicate crystal is grown from melt 145 in the presence of atmosphere 160.

Figure 5:
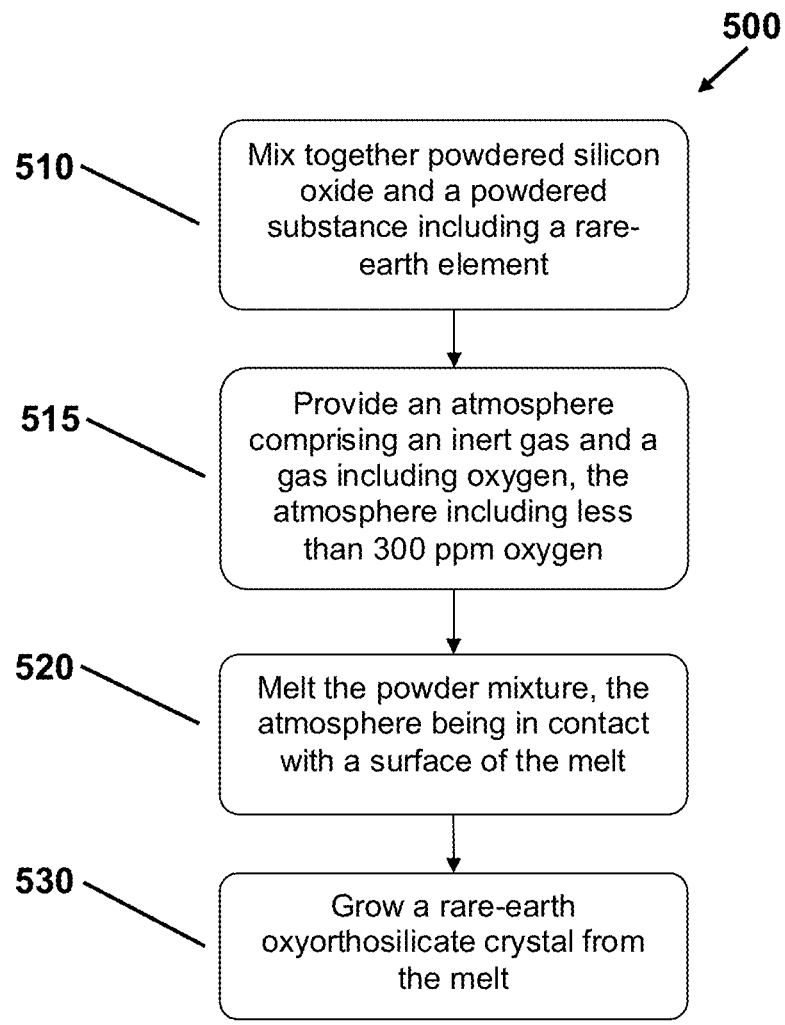
FIG. 5 is an example flow chart showing another method for growing a crystal.

FIG. 5 shows a second embodiment of a method of growing a rare-earth oxyorthosilicate crystal in a controlled atmosphere. A powdered substance comprising a first rare-earth element may be mixed with a powdered silicon oxide such as silica ($SiO_2$) 510. A second powdered substance comprising a second rare-earth element may be mixed with the powder mixture at step 510. The second powdered substance may be a rare-earth oxide or any rare-earth compound including an oxygen moiety. As an example, a powdered substance including cerium, such as a cerium oxide $CeO_2$, or any other material that can be calcined to cerium oxide, may be introduced into the powder mixture for the purpose of growing an oxyorthosilicate crystal doped with cerium as a scintillator crystal.

In step 515 an atmosphere, 160 in FIG. 1, is provided comprising an inert gas and a gas including oxygen, or a compound that disassociates to oxygen, such that the atmosphere includes less than 300 ppm oxygen In step 520 the powder mixture is melted in crucible 135 to produce melt 145, atmosphere 160 being in contact with a surface of the melt. In step 230 a rare-earth oxyorthosilicate crystal is grown from melt 145 in the presence of atmosphere 160.

The embodiments illustrated in FIGS. 2 and 5 include the use of powders for the silicon oxide, for a substance comprising at least one first rare-earth element, for a substance comprising at least one element from group 2, 3, 6, or 7, and, optionally, a substance comprising at least one second rare-earth element. Another embodiment includes use of different forms of matter for some or all of these example substances, including, but not limited to, liquids, sintered substances, granulated substances, pressed tablets, or solids that are not powdered.

Figure 3:
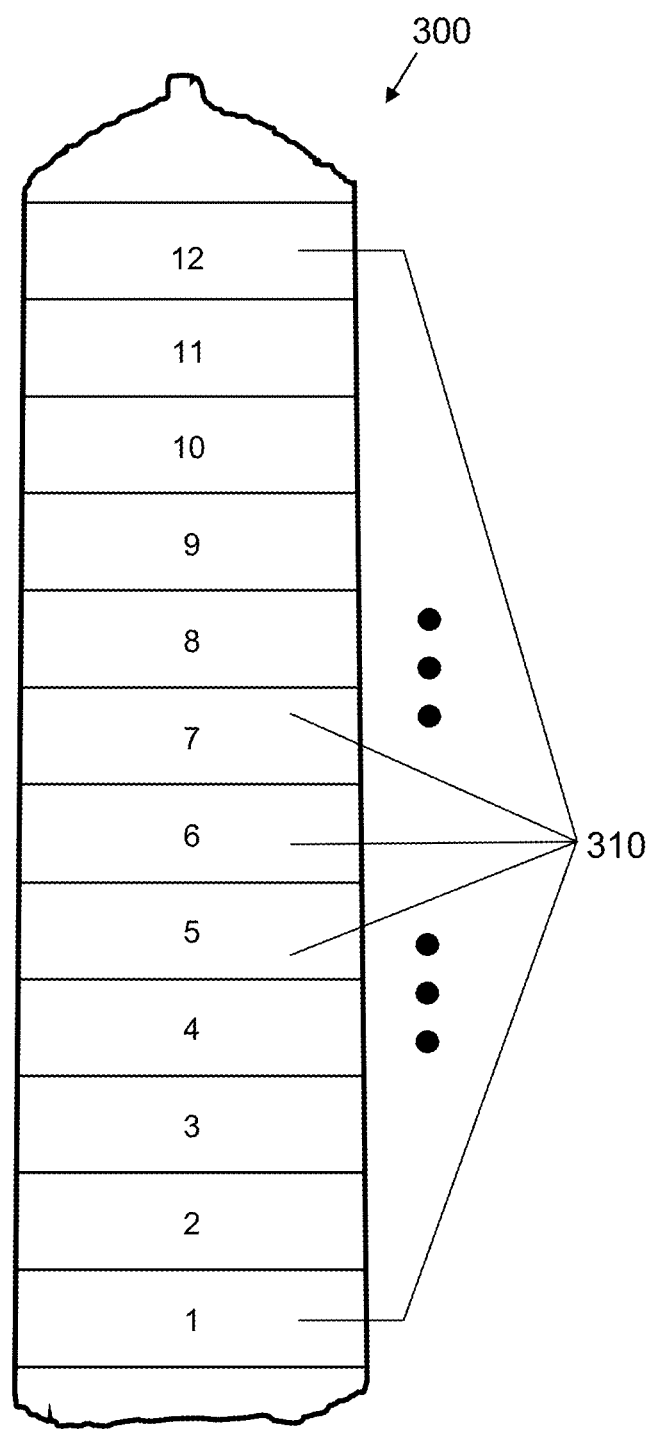
FIG. 3 shows an example crystal boule.

FIG. 3 shows an example of a crystal boule 300 grown according to a method described above. To evaluate the scintillation properties of crystals made by the methods illustrated in FIG. 2 or 3, boules were cut into multiple samples (slabs) and each sample was evaluated separately. FIG. 3 shows a boule cut into twelve samples 310. Sample 1 is taken from the bottom of the boule, that is, the last part of the boule to be grown. Sample 12 is taken from the top of the boule, that is, the first section to be grown.

Oxyorthosilicate crystals may be grown over the following ranges of conditions: temperature from 1900° C. to 2200° C. inclusive, withdrawal rates from 0.001 mm/hr to 10 mm/hr inclusive, and rotation rates from 0 to 100 rotations per minute (RPM), inclusive. These ranges are exemplary and under the methods described herein any one or more of these conditions may be varied within or outside these ranges as known in the art. Oxyorthosilicate crystals may be grown over ranges of temperature, withdrawal rate, and rotation rate that are restricted to being between any two numerical values, and including those numerical values, within the above ranges. Exemplary cerium-doped lutetium oxyorthosilicate scintillator crystal boules were grown according to an embodiment of the method described above. The crystals were grown in an atmosphere including argon and $CO_2$. The crystals were grown to about 80 mm in diameter and about 240 mm in length. Slabs 20 mm in thickness were cut from the crystals and numbered, starting from the bottom section of the crystal boule as shown in FIG. 3. Light output measurements were done under excitation with $Cs^{137}$ gamma source (662 keV). The scintillation light was collected using a Hamamatsu R877 photomultiplier.

Table 1 shows light output, energy resolution, and decay time of a scintillator crystal grown in an atmosphere as described above. Results are presented in Table 1 using arbitrary scales defined by numbers of channels of a Multichannel Analyzer (MCA) unit used in the measurements. A bismuth germinate crystal ($Bi_4Ge_2O_{12}$; BGO) was used as a reference. (BGO photopeak was set to the channel 100 position).

TABLE 1

| Slab # | Thickness [mm] | Light Output [Ch MCA]* | ER [%] | Decay Time [ns] |
|---|---|---|---|---|
| 1 | 20 | 594 | 13 | 45.2 |
| 2 | 20 | 590 | 12 | 45.3 |
| 3 | 20 | 605 | 12 | 45.8 |
| 4 | 20 | 642 | 13 | 45.9 |
| 5 | 20 | 640 | 11 | 46.7 |
| 6 | 20 | 634 | 11 | 46.5 |
| 7 | 20 | 634 | 12 | 47.3 |
| 8 | 20 | 642 | 10 | 47.0 |
| 9 | 20 | 646 | 11 | 47.2 |
| 10 | 20 | 640 | 11 | 47.0 |
| 11 | 20 | 645 | 11 | 46.9 |
| 12 | 20 | 626 | 11 | 46.4 |
| 13 | 20 | 612 | 12 | 45.5 |

Results shown in Table 1 are characteristic of rare-earth oxyorthosilicate scintillator crystals of the highest optical quality and efficiency. As pointed out above, this has been achieved without any post growth anneal.

Figure 4:
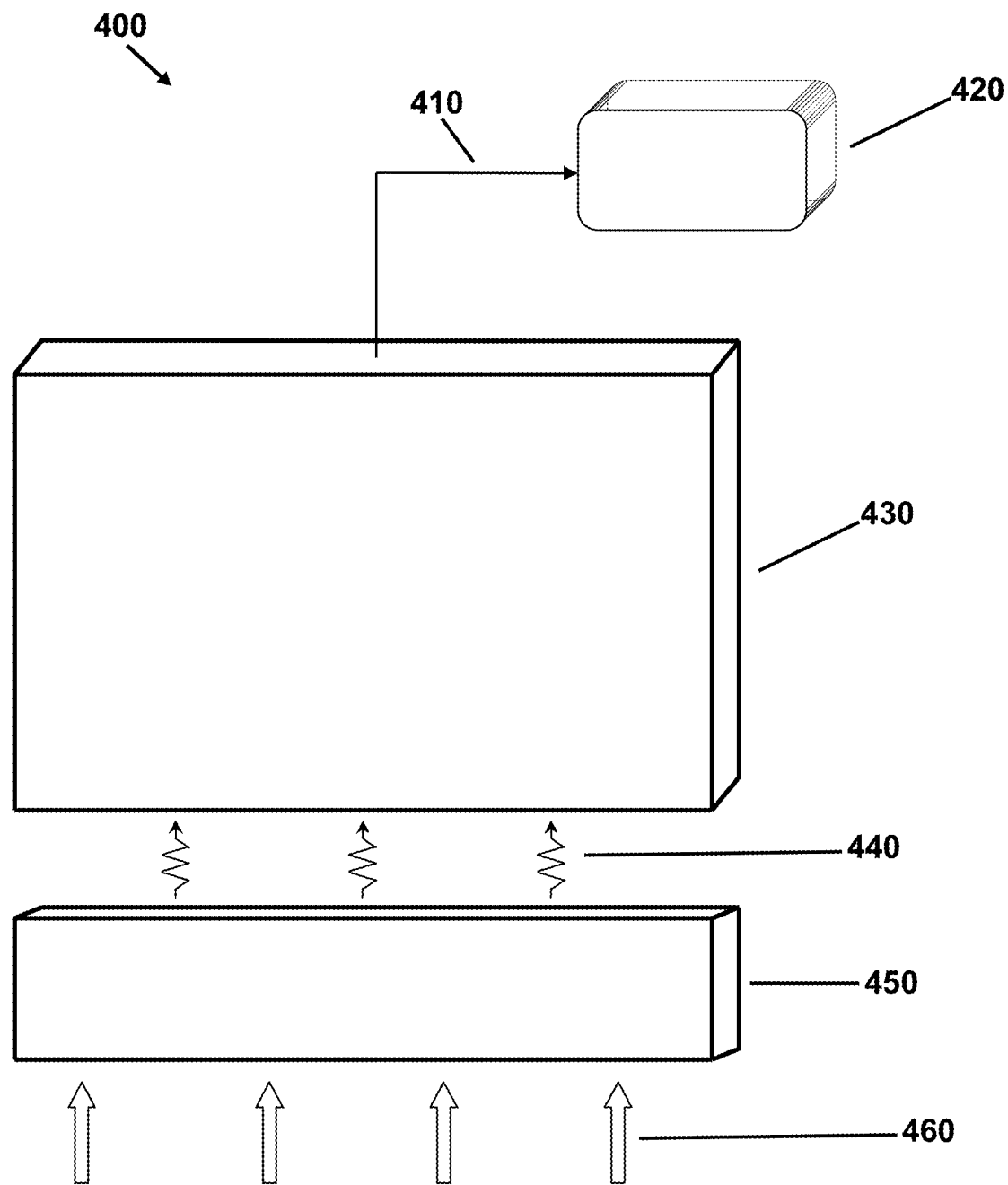
FIG. 4 shows an example of a scintillation counter.

FIG. 4 shows a scintillation counter 400 using as a detector a rare-earth oxyorthosilicate crystal 450 grown according to the method described above. Radiation 460, such as gamma photons, are absorbed by oxyorthosilicate crystal 450, resulting in emission of scintillation light 440 from oxyorthosilicate crystal 450. Scintillation light 440 is detected by light detector 430, such as a photomultiplier tube, avalanche photodiode, or any other light sensor. An electrical signal produced by light detector 430 is conveyed by electrical connection 410 to analyzing electronics 420. Information such as energy spectra and timing of radiation 460 may be extracted using analyzing electronics 420.

While the preceding description refers to certain embodiments, it should be recognized that the description is not limited to those embodiments. Rather, many modifications and variations may occur to a person of ordinary skill in the art which would not depart from the scope and spirit defined in the appended claims.

What is claimed is:

1. A method of growing a rare-earth oxyorthosilicate crystal, comprising:
   preparing a melt by:
   melting a first substance comprising at least one first rare-earth element;
   melting at least one of: a substance comprising a group 2 element, a substance comprising a group 3 element, a substance comprising a group 6 element, or a substance comprising a group 7 element;
   providing an atmosphere comprising an inert gas and a gas including oxygen, wherein the atmosphere comprises less than 300 parts per million of oxygen, the atmosphere being in contact with a surface of the melt; where the gas including oxygen is derived from the decomposition of one of an acid, a solid salt, a liquid salt, or a combination thereof; wherein the acid, the solid salt or the liquid salt comprises sodium carbonate, potassium carbonate, ammonium carbonate, copper carbonate, lanthanum carbonate, cesium carbonate, or a combination thereof; where the acid, the solid salt and/or the liquid salt is located in a vessel that contains the melt at the time of the decomposition;
   providing a seed crystal;
   contacting the surface of the melt with the seed crystal; and
   withdrawing the seed crystal from the melt.

2. The method of claim 1, wherein the gas including oxygen further comprises an additional oxygen-containing compound that disassociates to oxygen.

3. The method of claim 1, wherein the inert gas has a thermal conductivity less than or equal to 150 mW/m-° K at the temperature used during crystal growth.

4. The method of claim 1, wherein the gas including oxygen further comprises carbon dioxide.

5. The method of claim 1, wherein the gas including oxygen further comprises at least one of carbon monoxide, oxygen, sulfur trioxide, phosphorous pentoxide, or an oxide of nitrogen.

6. The method of claim 5, wherein the oxide of nitrogen comprises at least one of $NO_2$, $N_2O$, NO, $N_2O_3$, or $N_2O_5$.

7. The method of claim 1, wherein the atmosphere comprises less than 200 parts per million of oxygen.

8. The method of claim 7, wherein the inert gas comprises at least one of helium, argon, krypton, or xenon.

9. The method of claim 7, wherein the inert gas comprises nitrogen.

10. The method of claim 1, further comprising melting a second substance comprising a second rare-earth element, the second rare-earth element being incorporated into the rare-earth oxyorthosilicate crystal as a dopant.

11. The method of claim 10, wherein the second rare-earth element is cerium.

12. The method of claim 1, wherein the growing of the oxyorthosilicate crystal comprises growing a lutetium oxyorthosilicate crystal.

13. The method of claim 1, wherein the acid, the solid salt or the liquid salt further comprises a nitrate, a phosphate, a manganate, a permanganate, a sulfate, a phosphate, or a combination thereof.

14. A method of decreasing oxygen vacancies incorporated in a rare-earth oxyorthosilicate crystal, the method comprising:
   preparing a melt by melting a first substance comprising at least one first rare-earth element;
   providing an atmosphere comprising an inert gas and a gas including oxygen, the atmosphere including less than 300 ppm oxygen, the atmosphere being in contact with a surface of the melt; where the gas including oxygen is derived from the decomposition of one of an acid, a solid salt, a liquid salt, or a combination thereof; wherein the acid, the solid salt or the liquid salt comprises sodium carbonate, potassium carbonate, ammonium carbonate, copper carbonate, lanthanum carbonate, cesium carbonate, or a combination thereof; where the acid, the solid salt and/or the liquid salt is located in a vessel that contains the melt at the time of the decomposition;
   providing a seed crystal;
   contacting the surface of the melt with the seed crystal; and
   withdrawing the seed crystal from the melt.

15. The method of claim 14, wherein the gas including oxygen further comprises an additional oxygen-containing compound that disassociates to oxygen.

16. The method of claim 14, wherein the inert gas has a thermal conductivity less than or equal to 150 mW/m-° K at the temperature used during crystal growth.

17. The method of claim 15, wherein the additional oxygen-containing compound comprises carbon dioxide.

18. The method of claim 14, wherein the additional oxygen-containing compound comprises least one of carbon monoxide, oxygen, sulfur trioxide, phosphorous pentoxide, or an oxide of nitrogen.

19. The method of claim 18, wherein the oxide of nitrogen comprises at least one of $NO_2$, $N_2O$, $NO$, $N_2O_3$, or $N_2O_5$.

20. The method of claim 14, wherein the acid, the solid salt or the liquid salt further comprises a nitrate, a phosphate, a manganate, a permanganate, a sulfate, a phosphate, or a combination thereof.

* * * * *